(12) United States Patent
Eisenhardt

(10) Patent No.: US 8,222,844 B2
(45) Date of Patent: Jul. 17, 2012

(54) METHOD FOR DETERMINING THE MAGNET TEMPERATURE IN SYNCHRONOUS MACHINES

(75) Inventor: Martin Eisenhardt, Renningen (DE)

(73) Assignee: Robert Bosch GmbH, Stuttgart (DE)

(*) Notice: Subject to any disclaimer, the term of this patent is extended or adjusted under 35 U.S.C. 154(b) by 605 days.

(21) Appl. No.: 12/087,253

(22) PCT Filed: Dec. 18, 2006

(86) PCT No.: PCT/EP2006/069841
§ 371 (c)(1),
(2), (4) Date: Nov. 18, 2008

(87) PCT Pub. No.: WO2007/074097
PCT Pub. Date: Jul. 5, 2007

(65) Prior Publication Data
US 2009/0174351 A1    Jul. 9, 2009

(30) Foreign Application Priority Data
Dec. 27, 2005    (DE) .......................... 10 2005 062 588

(51) Int. Cl.
*H02P 6/00*    (2006.01)
(52) U.S. Cl. ......... 318/400.01; 318/400.07; 318/400.21; 318/471; 318/479
(58) Field of Classification Search ............. 318/400.01, 318/400.07, 400.08, 400.21, 400.32, 400.34, 318/471, 472, 479
See application file for complete search history.

(56) References Cited

U.S. PATENT DOCUMENTS

| | | | | |
|---|---|---|---|---|
| 3,932,793 A * | 1/1976 | Muller | ...................... | 318/400.04 |
| 4,806,832 A * | 2/1989 | Muller | ......................... | 388/833 |
| 4,879,497 A * | 11/1989 | Meyer et al. | ............. | 318/400.08 |
| 4,897,584 A * | 1/1990 | Grutzmacher et al. | ....... | 318/471 |
| 5,548,202 A * | 8/1996 | Schramm et al. | ............... | 322/33 |
| 6,046,554 A * | 4/2000 | Becerra | ...................... | 318/400.34 |
| 6,900,607 B2 * | 5/2005 | Kleinau et al. | ................. | 318/432 |
| 7,071,649 B2 * | 7/2006 | Shafer et al. | ................... | 318/783 |
| 7,099,793 B2 * | 8/2006 | Rechberger | .................... | 702/130 |
| 7,319,300 B2 * | 1/2008 | Hahn | ....................... | 318/400.32 |
| 7,340,968 B2 * | 3/2008 | Schneider et al. | .......... | 73/862.08 |
| 7,692,399 B2 * | 4/2010 | Harriman et al. | ............. | 318/798 |
| 7,746,013 B2 * | 6/2010 | Fernengel et al. | ........ | 318/400.07 |

FOREIGN PATENT DOCUMENTS

| | | |
|---|---|---|
| EP | 1 014 554 | 6/2000 |
| JP | 08 317684 | 11/1996 |
| JP | 2005 012914 | 1/2005 |

OTHER PUBLICATIONS

"Selten-Erd-Dauermagnete", Vacodym-Vacomax, p. 36 (with translation).
Chan, W. C., et al., "Temperature Dependence of Magnetic Flux Drag Torque for a Single Grain $YBa_2Cu_3O_7$ Superconductor," Tamkang Journal of Science and Engineering, vol. 11, No. 2, pp. 127-130 (2008).

* cited by examiner

*Primary Examiner* — Walter Benson
*Assistant Examiner* — Thai Dinh
(74) *Attorney, Agent, or Firm* — Kenyon & Kenyon LLP

(57) ABSTRACT

A method for determining the magnet temperature of a permanent magnet electrical machine. The magnet temperature is able to be determined particularly simply and accurately if a phase voltage and the rotational speed of the electrical machine are measured, and the magnet temperature is determined from this.

14 Claims, 1 Drawing Sheet

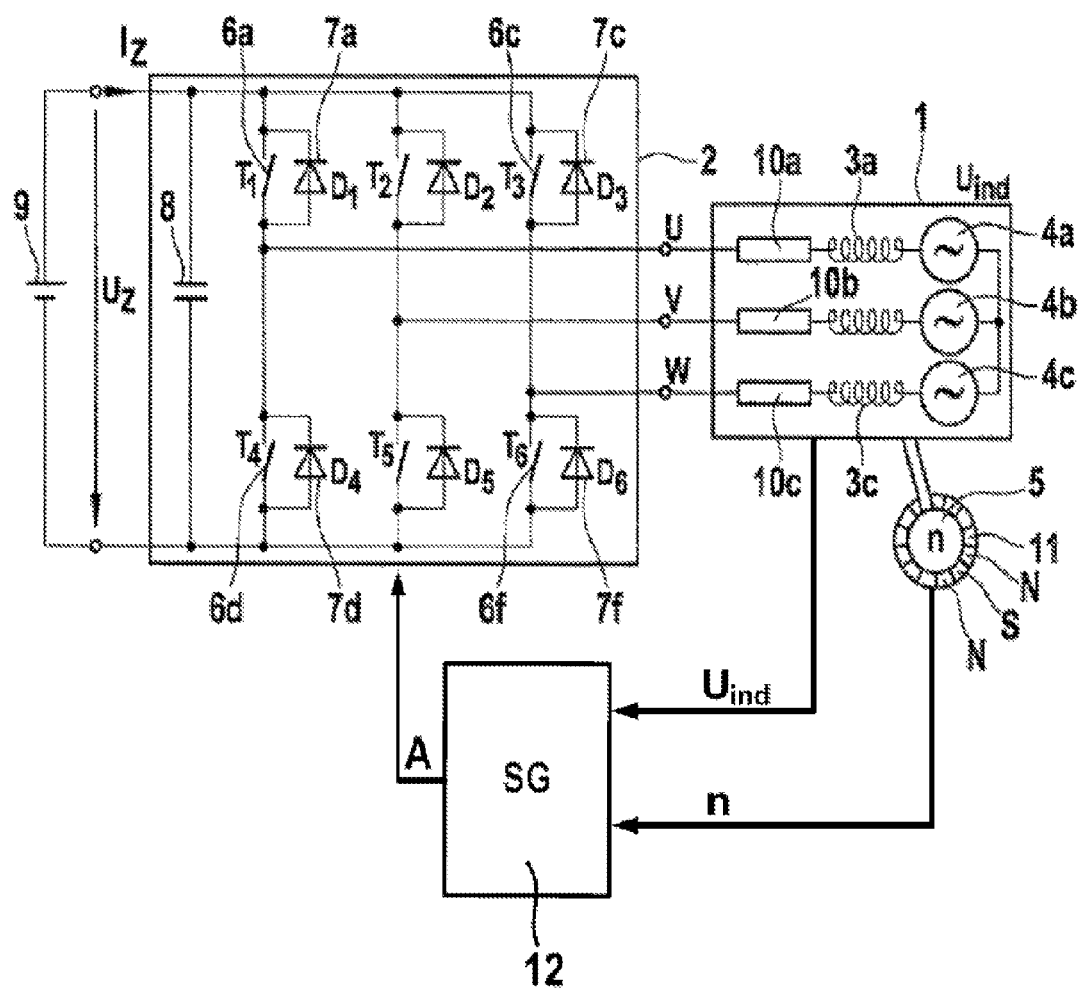

METHOD FOR DETERMINING THE MAGNET TEMPERATURE IN SYNCHRONOUS MACHINES

FIELD OF THE INVENTION

The present invention relates to a method for determining the magnet temperature of an electrical, particularly a permanent magnet electrical machine, and also to a corresponding device.

BACKGROUND INFORMATION

Permanent magnet electrical machines are frequently used in hybrid vehicles as electrical drives. Permanent magnet synchronous machines include a rotor, in which the magnets generating the magnetic flux are usually situated. The magnets are relatively temperature sensitive, and may be permanently damaged at temperatures which, under certain circumstances, may be reached already at normal driving operation of a hybrid vehicle. In order to prevent this, the phase currents are usually limited beginning at the attainment of a critical magnet temperature.

Since the rotor is a revolving component part, and the temperature of the magnet is thus directly measured only with great effort, the magnet temperature is usually estimated from the measured stator temperature. In making this estimation of the magnet temperature, one assumes that the rotor and the permanent magnets are at approximately the same temperature as the stator. However, this estimation is subject to errors, particularly in response to transient processes.

In order to maintain a sufficiently great safety margin from a maximum permissible magnet temperature, the temperature threshold for the above-mentioned limitation of the phase current has to be selected to be relatively low. Consequently, the maximum performance of the machine cannot be completely utilized.

SUMMARY OF THE INVENTION

It is therefore an object of the present invention to provide a method for determining the magnet temperature of the magnets of a permanent magnet electrical machines, using which the magnet temperature is able to be determined substantially more accurately, and thus the electrical machine is able to be used up to higher temperatures at maximum power.

In accordance with the present invention, this objective is achieved by the features according to the present invention.

One important aspect of the present invention is to measure a phase voltage and the rotational speed of the electrical machine, and to determine the magnet temperature from the phase voltage and the rotational speed. In order to do this, the present invention utilizes the knowledge that the generated magnetic flux $\psi$ is a function of magnet temperature T, where $$\psi = f(T).$$

The following correspondingly applies for T:

$$T = f^{-1}(\psi).$$

For the magnets used, the inverse function $T = f^{-1}(\psi)$, for example, is ascertained offline, and is stored in a characteristics map.

Magnetic flux $\psi$ may be ascertained via the law of induction, for which the following applies:

$$U_{ind} = \omega \psi$$

or $$\psi = U_{ind}/\omega,$$

where
$U_{ind}$ is the induced voltage of the electrical machine at idling, and
$\omega$ is the electrical angular frequency The electrical angular frequency $\omega$ is:

$$\omega = 2\pi n p/60,$$

where
p is the number of pole pairs
n is the rotational speed of the machine
Consequently, $$T = f^{-1}(\psi) = f^{-1}(U_{ind}, n)$$

Thus the magnet temperature is able to be ascertained from the induced voltage $U_{ind}$ and the rotational speed n. This has the substantial advantage that the magnet temperature is able to be determined far more accurately, and consequently, the electrical machine is able to be operated up to a higher temperature threshold at higher performance. Only after this high threshold is attained, measures have to be initiated to protect the electrical machine.

Induced phase voltage $U_{ind}$ is preferably measured during idling of the electrical machine, at a sufficiently high rotational speed n. During idling, the power switches of the pulse-controlled inverter are all open, and phase voltage $U_{ind}$ present at the terminal of the machine is sinusoidal.

Induced phase voltage $U_{ind}$ may be measured, for instance, between any two of the phases, e.g. U and V, or between a phase and a reference potential. For the following calculation, the peak value of the measured phase voltage is preferably ascertained. This corresponds to the above-mentioned induced voltage $U_{ind}$.

Magnet temperature T may be calculated analytically, for instance, with the aid of named function $T = f^{-1}(n, U_{ind})$, or read off from an appropriate characteristics map.

The electrical machine is preferably connected to a pulse-controlled inverter. In this case, the phase voltage is preferably measured at a rotational speed that is less than a specified maximum rotational speed. This ensures that the phase voltage does not exceed the intermediate circuit voltage or network voltage, and the regenerative diodes of the pulse-controlled inverter do not become conductive.

In the following, the present invention is explained in greater detail by way of example, with reference to the attached drawing.

FIG. 1 shows a schematic representation of a permanent magnet synchronous machine 1 having a pulse-controlled inverter 2 (PWR). PWR 2 determines the performance and the manner of operation of electrical machine 1, and is appropriately controlled by control unit 12. Electrical machine 1 is thereby able to be operated optionally in motor operation or in generator operation. In motor operation the electrical machine generates an additional drive torque, which supports the internal combustion engine, for instance, in an acceleration phase. On the other hand, in generator operation mechanical energy is converted to electrical energy and is stored in an energy store, such as a battery 9 or a super cap.

In this case, electrical machine 1 is designed to be 3-phase (phases U, V, W) and includes a stator having three phase windings 3a-3c and a rotor having a plurality of permanent magnets 11. The ohmic resistances of phase windings 3a-3c are designated by 10a-10c.

The three phases U, V, W of electrical machine 1 are in each case connected to the pulse-controlled inverter. In a known manner, PWR 2 includes several switches 6a-6f, using which the individual phases U, V, W are able to be connected optionally to any intermediate circuit potential $U_z$ or a reference potential (ground). Furthermore, PWR 2 includes several recovery diodes 7a-7f, which are connected respectively in parallel to one of switches 6a-6f.

To determine the magnet temperature of permanent magnets 11, a mathematical model described at the outset, that is stored in control unit 12, is drawn upon. The algorithm determines the magnet temperature T from induced voltage $U_{ind}$ and from the rotational speed of electrical machine 1. The following equation applies:

$$T=f^{-1}(\psi)=f^{-1}(n,U_{ind})$$

Rotational speed n of the electrical machine is measured using a rotational speed sensor 5. The voltage induced in stator windings 3a-3c is shown here schematically by voltage sources 4a-4c. As the induced voltage $U_{ind}$, the voltage between two of the phases, e.g. U and V, or the voltage between one of the phases U, V, W and a reference potential may be measured, for example. This voltage is sinusoidal and is preferably measured during idling of machine 1. During idling, all six power switches 6a-6f of pulse-controlled inverter 2 are open.

The rotational speed of electrical machine 1 has to be sufficiently great during the measurement, but on the other hand it must not exceed a maximum rotational speed, beginning at which recovery diodes 7a-7f act as rectifier bridges. Otherwise the phase voltages would be distorted and no longer sinusoidal.

Voltage signals and rotational speed signals ($U_{ind}$ and n) are supplied to control unit 12 at the input. The algorithm stored in control unit 12 processes the values, and determines from this magnet temperature T. If a specified temperature threshold is exceeded, control unit 12 generates an output signal A for pulse-controlled inverter 2, by which the power of electrical machine 1 is reduced, and with that, overheating is able to be avoided.

The above-mentioned function or inverse function $T=f^{-1}(n, U_{ind})$ may either be evaluated analytically or may be stored in a control unit as a characteristics map, for instance. Magnet temperature T may be determined particularly accurately and simply, in this manner, by retrieving associated magnet temperature T from the characteristics map, for measured values of n and $U_{ind}$.

What is claimed is:

1. A method for determining a magnet temperature of an electrical machine, comprising:
    ascertaining a peak value of a phase voltage;
    measuring a rotational speed of the electrical machine; and
    determining the magnet temperature as a function of the peak value of the phase voltage and the rotational speed;
    wherein:
        the magnet temperature is calculated with the aid of a function $T=f^{-1}(n, U_{ind})$;
        n is the rotational speed; and
        $U_{ind}$ corresponds to the peak value of the phase voltage.

2. The method according to claim 1, wherein the machine is a permanent magnet electrical machine.

3. The method according to claim 1, wherein the phase voltage is measured during idling of the electrical machine.

4. The method according to claim 1, wherein the phase voltage is measured at a rotational speed that is less than a specified maximum rotational speed.

5. The method according to claim 1, further comprising:
    limiting phase currents of the electrical machine if the magnet temperature exceeds a specified threshold value.

6. The method according to claim 1, further comprising:
    supplying a voltage signal and a rotational speed signal to a control unit; and
    executing an algorithm stored in the control unit to determine the measuring of the phase voltage and the rotational speed of the electrical machine based on the voltage signal and the rotational speed signal.

7. The method according to claim 1, further comprising:
    limiting phase currents of the electrical machine if the magnet temperature exceeds a specified threshold value;
    wherein the machine is a permanent magnet electrical machine.

8. The method according to claim 7, wherein the phase voltage is measured during idling of the electrical machine.

9. The method according to claim 7, wherein the phase voltage is measured at a rotational speed that is less than a specified maximum rotational speed.

10. The method according to claim 7, further comprising:
    supplying a voltage signal and a rotational speed signal to a control unit; and
    executing an algorithm stored in the control unit to determine the measuring of the phase voltage and the rotational speed of the electrical machine based on the voltage signal and the rotational speed signal.

11. The method according to claim 1, wherein the phase voltage is determined from two different phases of a three-phase alternating current.

12. A device for determining a magnet temperature of an electrical machine, comprising:
    a control unit having an algorithm for determining the magnet temperature as a function of a peak value of a phase voltage signal and a rotational speed signal which are supplied to the control unit;
    wherein:
        the magnet temperature is calculated with the aid of a function $T=f^{-1}(n, U_{ind})$;
        n represents the rotational speed signal; and
        $U_{ind}$ corresponds to the peak value of the phase voltage signal.

13. The device according to claim 12, wherein the machine is a permanent magnet electrical machine.

14. The device according to claim 12, wherein the control unit generates an output signal for controlling a pulse-controlled inverter.

* * * * *